United States Patent [19]

Landman et al.

[11] Patent Number: 4,795,974
[45] Date of Patent: Jan. 3, 1989

[54] DIGITAL ENERGY METER

[75] Inventors: Ronald G. Landman, Ypsilanti; Harold G. Spring, Garden City; Joseph C. Burba, Ypsilanti, all of Mich.

[73] Assignee: Ford Motor Company, Dearborn, Mich.

[21] Appl. No.: 77,579

[22] Filed: Jul. 24, 1987

[51] Int. Cl.$^4$ ............... G01R 21/00; G01R 21/133; G01R 22/00
[52] U.S. Cl. ................ 324/142; 324/103 R; 364/483
[58] Field of Search .......... 324/142, 103 R; 364/483, 754, 757; 328/160

[56] References Cited

U.S. PATENT DOCUMENTS

| | | | |
|---|---|---|---|
| 3,718,860 | 2/1973 | Kwast et al. | 324/142 |
| 4,004,140 | 1/1977 | Izumi et al. | 364/757 |
| 4,031,377 | 6/1977 | Deutsch et al. | 364/757 |
| 4,079,313 | 3/1978 | Callan | 324/142 |
| 4,104,729 | 8/1978 | Gingell | 364/757 |
| 4,125,895 | 11/1978 | Buhlmann | 364/483 |
| 4,165,485 | 8/1979 | Takahashi | 324/142 |
| 4,345,311 | 8/1982 | Fielden | 324/142 |
| 4,360,879 | 11/1982 | Cameron | 324/142 |
| 4,534,045 | 8/1985 | Collier | 324/142 |
| 4,566,076 | 1/1986 | Van der Steen | 364/757 |
| 4,573,136 | 2/1986 | Rossiter | 364/757 |
| 4,622,640 | 11/1986 | Shimamura et al. | 364/483 |
| 4,672,555 | 6/1987 | Hart et al. | 324/142 |
| 4,680,727 | 7/1987 | White | 364/757 |

OTHER PUBLICATIONS

"A Wide-Range Digital Power/Energy Meter for Systems with Nonsinusoidal Waveforms", by Matouka, IEEE Trans. on Indus. Elect., vol. IE-29, #1, 2/82, pp. 18–31.

Primary Examiner—Reinhard J. Eisenzopf
Assistant Examiner—W. Burns
Attorney, Agent, or Firm—Allan J. Lippa; Peter Abolins

[57] ABSTRACT

A digital energy meter for providing energy measurements of nonsinusoidal waveforms. Voltage and related current components of a digitally sampled waveform are multiplied to form a product representative of instantaneous power. The products are summed or accumulated over a first time period, and the sums then accumulated over a second time period to form a second sum representative of total power over the second time period. An energy measurement is then obtained by an algorithm which requires only a simple division by a power of two.

9 Claims, 2 Drawing Sheets

P (t)
INSTANTANEOUS
POWER

P (T)
TOTAL POWER /T

P (NT)
TOTAL POWER /NT

E
ENERGY /NT

DIGITAL ENERGY METER

BACKGROUND OF THE INVENTION

The invention relates to digital energy meters.

A known approach for measuring the energy in a waveform is to multiply the voltage and current components of the waveform by analog means and transform the product into a digital value by a voltage-to-frequency converter. Examples of this approach are disclosed in U.S. Pat. Nos. 3,718,860; 4,079,313; and 4,360,879. One problem with these approaches is the drift in the analog devices.

Another known approach is to convert the respective voltage and current components into digital form for processing through a computationally intense algorithm in a microprocessor. Examples of this approach are disclosed in U.S. Pat. No. 4,345,311 and IEEE Paper (Volume IE-29, No. 1, February 1982) entitled "A Wide-Range Digital Power/Energy Meter for Systems with Nonsinusoidal Waveforms". A problem with these approaches is the complexity of the computations required to obtain a measurement of energy.

SUMMARY OF THE INVENTION

It is an object of the present invention to provide both a digital energy meter and a method for measuring the energy of nonsinusoidal waveforms with minimal arithmetic operations.

In one aspect of the invention, the above and other problems are overcome, and object achieved, by providing a method for measuring the energy of an electrical signal comprising the following steps: converting a sampled voltage component and related sampled current component of the electrical signal into respective digital words by sampling a pair of analog-to-digital converters at a predetermined sampling frequency; multiplying the respective digital words together each sample time to form a digital product representative of instantaneous power; accumulating the products over a predetermined time period to form a digital sum representative of total power during the predetermined time period; dividing the digital sum by a predetermined scaling number times the predetermined sampling frequency to form a measurement of energy, the dividing step comprising a deletion of a predetermined number of least significant bits, the scaling number converting the energy units formed by dividing the digital sum by the predetermined sampling frequency into desired energy units; and generating the predetermined sampling frequency such that the scaling number times the predetermined sampling frequency is equal to the number 2 taken to the power of the predetermined number of least significant bits.

One advantage obtained by the above method is that the algorithm or arithmetic operation for obtaining an energy measurement requires only deleting the required number of least significant bits. This may be accomplished, for example, by simply shifting the contents of a shift register towards the least significant bit position by the predetermined number of least significant bits. The algorithm may also be accomplished by reading only the required number of most significant bit positions. Another advantage is that the meter is able to measure DC and periodic as well as aperiodic and chopped waveforms.

In another aspect of the invention, the method for measuring electrical energy of an electrical signal comprises the following steps: converting a sampled voltage component and related sampled current component of the electrical signal into respective digital words by sampling a pair of analog-to-digital converters at a predetermined sampling frequency; multiplying the respective digital words together each sample time to form a digital product representative of instantaneous power; accumulating the products over a first predetermined time period to form a first digital sum representative of total power during the first predetermined time period; accumulating the first digital sums over a second predetermined time period to form a second digital sum representative of total power during the second predetermined time period; dividing the second digital sum by a predetermined scaling number times the predetermined sampling frequency to form a measurement of energy, the dividing step comprising a deletion of a predetermined number of least significant bits, the scaling number converting the energy units formed by dividing the second digital sum by the predetermined sampling frequency into desired energy units; and generating the predetermined sampling frequency such that the scaling number times the predetermined sampling frequency is equal to the number 2 taken to the power of the predetermined number of least significant bits. Preferably, the second time period is selectable such as, for example, by operator selection to achieve a desired time period for obtaining a measurement of energy.

An additional advantage is thereby obtained of changing the time period for which an energy reading is desired without any changes in the computational algorithm. Another advantage is that by using two accumulator steps, the size of each accumulator required for the respective steps is reduced. Accordingly, the structure required to carry out these steps is simplified.

DESCRIPTION OF THE PREFERRED EMBODIMENT

Figure 1:
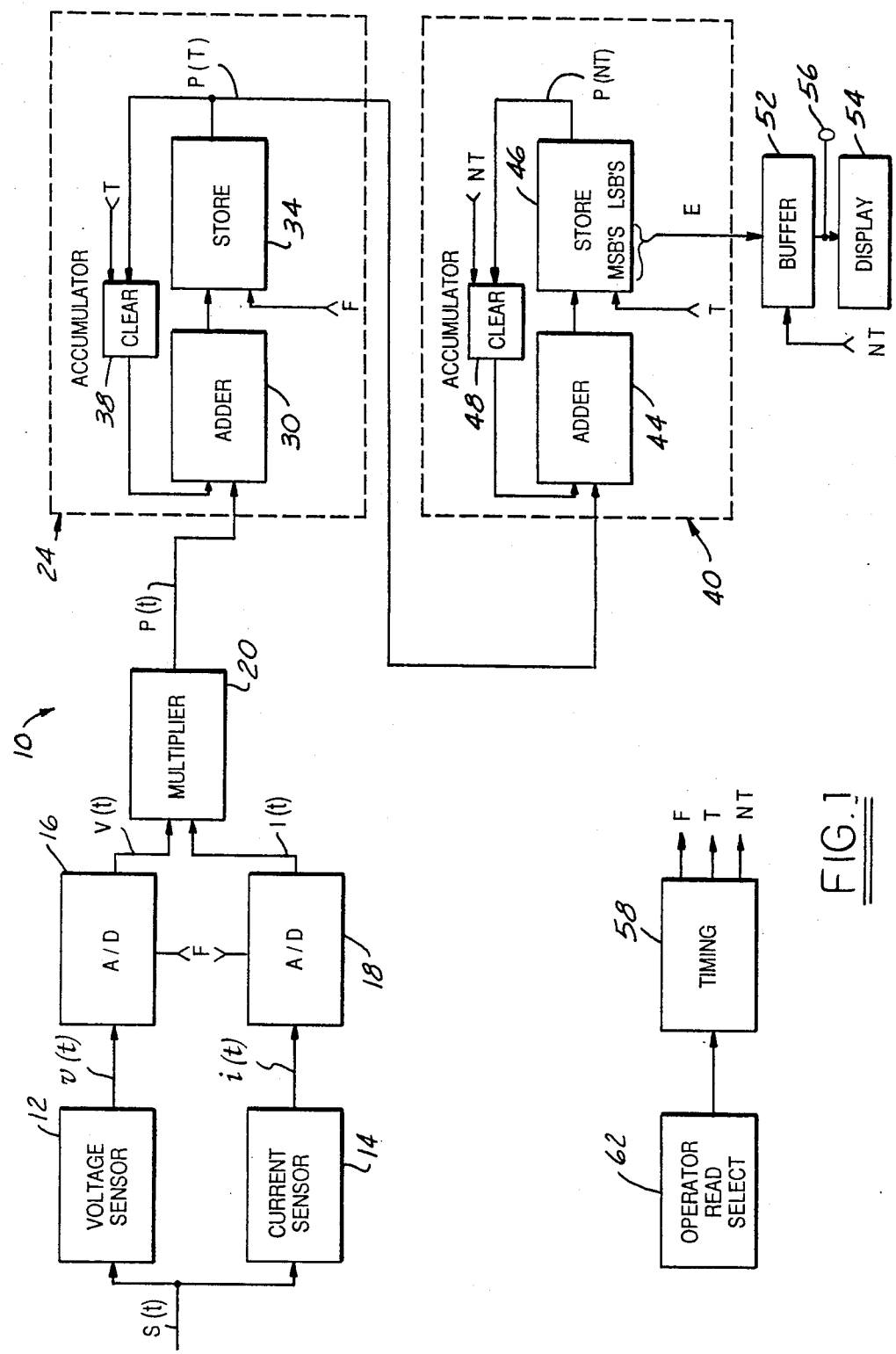
FIG. 1 is a block diagram of an embodiment in which the invention is used to advantage.

Referring first to FIG. 1 a block diagram of digital meter 10 is shown for measuring the power and energy of an electrical signal s(t). More specifically, voltage sensor 12 and current sensor 14 are shown coupled to electrical signal s(t) for producing a voltage component v(t) and related current component i(t) of electrical signal s(t). A pair of analog-to-digital converters 16 and 18 are shown respectively coupled to voltage sensor 12 and current sensor 14. Analog-to-digital converters 16 and 18 operate at a sampling frequency F for converting v(t) and i(t) into respective digital words V(t) and I(t) once each sampling time (1/F). Multiplier 20 multiplies V(t) and I(t) once each sample time to produce a product P(t) representative of instantaneous electrical power.

Accumulator 24 is shown coupled to multiplier 20 for accumulating the products P(t) over a predetermined number of sample times, referred to hereinafter as T. More specifically, accumulator 24 is shown including an adder 30 having inputs coupled to both multiplier 20 and storage device 34 via clear logic 38. Storage device 34 is coupled to the output of adder 30 and clocked or updated at the sampling frequency F. Clear logiC 38 blocks the accumulated sum in storage device 34 from adder 30 once each time period T thereby resetting accumulator 24.

Figure 2A:
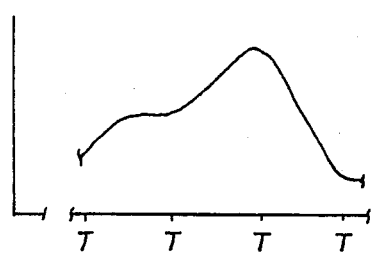
FIG. 2A illustrates an electrical waveform associated with a computation performed by a portion of the embodiment shown in FIG. 1 wherein the computation is of instantaneous power P(t) of an electrical signal s(t).
Figure 2B:
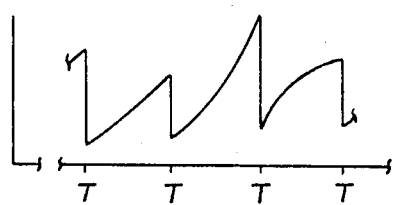
FIG. 2B illustrates an electrical waveform associated with a computation performed by a portion of the embodiment shown in FIG. 1 wherein the computation is of accumulated power P(T) of an electrical signal s(t) over a predetermined time period T.
Figure 2C:
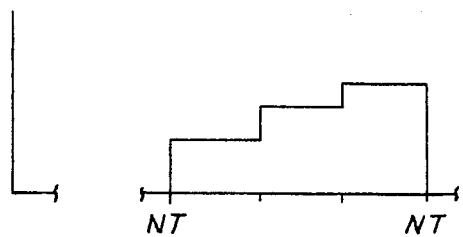
FIG. 2C illustrates an electrical waveform associated with a computation performed by a portion of the embodiment shown in FIG. 1 wherein the computation is of accumulated power P(NT) of an electrical signal s(t) over a predetermined time period NT.

In accordance with the above description and with reference to FIGS. 2A and 2B, accumulator 24 accumulates the instantaneous power P(t) of electrical signal s(t) each sampling time over time period T. Thus, at the end of each time period T, the sum stored in storage device 24 is representative of the total power of electrical signal s(t) over time period T referred to hereinafter as P(T).

The sum stored in storage device 34 may be coupled to conventional displays (not shown) for providing a total power measurement; or, it may be divided by T utilizing conventional circuitry (not shown) for providing a measurement of average power.

Referring now to FIGS. 1 and 2A through 2C, accumulator 40 is shown coupled to the output of accumulator 24 for-accumulating the final sum P(T) stored in accumulator 24 over a selected number of time periods NT. Thus, the value stored in accumulator 40 at the end of time period NT is representative of the total power P (NT) in signal s(t) over time period NT.

Accumulator 40 is shown herein as an adder 44 coupled to storage device 46. More specifically, adder 44 is shown having inputs coupled to the output of accumulator 24 and also to the output of storage device 46 via clear logic 48. The input of storage device 46 is coupled to the output of adder 44 and clocked or updated once each time period T. Clear logic 48 blocks the accumulated sum in storage device 46 from adder 44 once each time period NT thereby resetting accumulator 40.

The algorithm by which accumulated power P(NT) is converted into an energy value E is now described. In general terms, the power accumulated over time period NT is converted into energy by dividing the sampling frequency F into P(NT). Appropriate division is also required to scale the resulting quotient into the desired energy units as shown in the equation below:

$$E = \frac{P(NT)}{F*S} \quad S = \frac{TS}{[A/DS]*WS}$$

The analog-to-digital converter scaling number A/DS is required to convert the digital word P(NT) into watts as determined by the respective voltage scaling and current scaling of analog to digital converters 16 and 18. The watt scaling number WS further converts the watt measurement into the desired watt scale such as, for example, to convert watts to mwatts. Similarly, the time scaling number TS converts the time units resulting from division by F into desired time units such as, for example, to convert seconds to hours. All three scaling numbers are shown as one overall scaling number S in the above equation.

Division by FS is herein accomplished by deleting a number of P(NT) least significant bits (n) equal to the product of S times F. Thus, F and n are selected to satisfy the required sampling criteria and also the relationship expressed below:

$$F = \frac{2^n}{S}$$

For purposes of illustration, an example of the power to energy conversion described hereinabove is presented for a case where energy in mwatt-hours is desired. Although the conversion is described with respect to particular parameters such as voltage, current and time, it is to be understood that these parameters are presented only for illustrative purposes. Those skilled in the art will recognize that the invention described herein may be used to advantage with any parameters desired.

Analog to digital converters 16 and 18 are 12 bit converters with a scaling of 0.25 volts/bit and 0.25 amps/bit, respectively. The sum of the V(t) times I(t) products is then in units of 2−−4 watts. Analog to digital scaling number A/DS is therefore in units of 2−−4 watts/bit. Since mwatt hours are desired, the watt scaling number WS is 1000 (mwatts/watt) and the time scaling number TS is 3600 (seconds/hour). Accordingly, the total scaling number S is 57.6. Thus, F=$2^n$/57 6.

With a value for n of 26, a corresponding sampling frequency of 1.1650844 Mhz is more than sufficient to satisfy the Nyquist sampling theorem. More specifically, a 580 Khz bandwidth is more than adequate to measure the energy content of higher harmonics (50th harmonic) in chopper devices and inverter driven motors having fundamental frequencies of 1-3 Khz.

Continuing with the illustrative example, a 24 bit V(t) times I(t) product and a 35 bit capacity for storage device 34 results in a time period T of 1.76 msec. With a 56 bit capacity for storage device 46, the 26 least significant bits are deleted to accomplish the division of P(NT) by FS Stated another way, the power accumulated over a time period NT is converted into energy in units of mwatt/hours by simply deleting the 26 least significant bits in storage device 46. The least significant bit deletion may be accomplished with a number of conventional techniques such as, for example, by either truncation or shifting storage device 46 by 26 bits towards the least significant bit location.

Figure 2D:
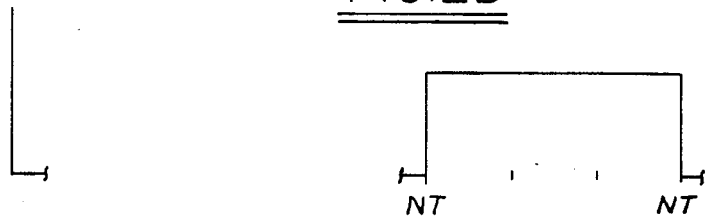
FIG. 2D illustrates an electrical waveform associated with a computation performed by a portion of the embodiment shown in FIG. 1 wherein the computation is of energy E of an electrical signal s(t) over a predetermined time period NT.

Referring back to FIG. 1, the FS division described hereinabove is shown executed by reading the appropriate number of most significant bits into buffer 52 each time period NT. Stated another way, the number of least significant bits required for the division of P(NT) by FS are not read from storage device 46. Accordingly, the value transferred into buffer 52 is a digital representation of the energy E of signal s(t) over time period NT expressed in the desired energy units (FIG. 2D). The energy value may be read out in digital display 54, or transferred via output port 56 to ancillary equipment for further processing or analysis.

FIG. 1 also shows timing generator 58 wherein sampling frequency F and time period T are generated by dividing the output of a quartz crystal clock in a conventional manner. Similarly, timing generator 58 generates time period NT based upon the selection of N from operator read select 62.

This concludes the description of the preferred embodiment. The reading of it by those skilled in the art will bring to mind many alterations and modifications without departing from the spirit and scope of the invention. Accordingly, it is intended that the scope of the invention be limited onlY by the following claims.

We claim:

1. An apparatus for measuring the energy of an electrical signal over a preselected time period, comprising:
   converting means for converting a sampled voltage component and related sampled current component of said electrical signal into respective digital words by sampling a pair of analog to digital converters at a predetermined sampling frequency;
   multiplying means for multiplying said respective digital words together each sampling time to form a digital product representativ of instantaneous power;
   first accumulating menns for accumulating said products over a predetermined time period to form a first digital sum representative of total power during said predetermined time period, said first accumulating means comprising a series interconnection of a first adder and a first shift register wherein said first adder has inputs connected to said multiplier means and the output of said fist shift register, said first shift register being clocked at said predetermined sampling freqency;
   second accumulating means for accumulating said first digital sums over a preselected time period to form a second digital sum representative of total power during said preselected time period, said second accumulating means comprising a series interconnection of a second adder and a second shift register wherein said second adder has inputs connected to said second accumulating means and the output of said second shift register, said second shift register being clocked at said predetermined sampling frequency;
   dividing means for dividing said second digital sum by a predetermined scaling number times said predetermined sampling frequency to form a measurement of energy during the preselected time period, said dividing means deleting a predetermined number of least significant bits, said scaling number converting the energy units formed by dividing said second digital sum by said predetermined sampling frequency is equal to the number two taken to the power of said predetermined number of least significant bits.

2. An apparatus for measuring the energy of an electrical signal over a preselected time period, comprising:
   a pair of analog to digital converters operating at a predetermined sampling frequency for converting a voltage componenet and a related current component of said electrical signal into respective dlgital words each sampling time;
   a multiplier for multiplying said respective digital words together each of said sampling times to form a digital product representative of instantaneous power;
   first accumulator means for accumlating said prodcts over a predetermined time period to form a first digital sum representative of total power during said first predetermined time period, said first accumulator means comprising a series interconnection of a first adder and a first storage device clocked at said predetermined sampling frequency and having its output connected back to said adder;
   second accumulator means for accumulating said first digital sums over a preselected time period to form a second digital sum representative of total power during said preselected time period, said second accumulator means comprising a series interconnection of a second storage device and a second adder coupled to both said first accumulator means and said second storage device, said second storage device being clocked at said predetermined sampling frequency and having its output connected back to said second adder;
   dividing means for dividing said second digital sum by a predetermined scaling number times said predetermined sampling frequency to form a measurement of energy, said scaling number converting the energy units formed by dividing said second digital sum by said predetermined sampling frequency into desired energy units, said dividing means comprising selecting means for selecting said second digital sum from said storage device less said predetermined number of least significant bits; and
   generating means for generating said predetermined sampling frequency such that said scaling number times said predetermined sampling frequency is equal to the number two taken to the power of said predetermined number of least significant bits.

3. The apparatus recited in claim 2 wherein said selecting means comprises means for shifting said shift register towards a least significant bit location by said predetermined number of least significant bits.

4. The apparatus recited in claim 3 wherein said first predetermined time period comprises a predetermined number of said sampling times.

5. The apparatus recited in claim 4 wherein said preselected time period comprises a predetermined number of said first predetermined time periods.

6. The apparatus recited in claim 5 further comprising means for selecting said preselected time period by an operator.

7. The apparatus recited in claim 6 wherein said predetermined number of least significant bits remains constant regardless of said preselected time period selected.

8. The apparatus recited in claim 7 further comprising a display coupled to said storage device.

9. The apparatus recited in claim 8 further comprising an output coupled port to said storage device.

* * * * *

UNITED STATES PATENT AND TRADEMARK OFFICE
CERTIFICATE OF CORRECTION

PATENT NO.   : 4,795,974
DATED        : January 3, 1989
INVENTOR(S)  : Landman et al It is certified that error appears in the above-identified patent and that said Letters Patent is hereby corrected as shown below:

On the title page

Under the heading "Inventors" and after
"Joseph C. Burba, Ypsilanti" add
--James E. Fenton, Ann Arbor--

Signed and Sealed this

Fourth Day of July, 1989

Attest:

DONALD J. QUIGG

Attesting Officer

Commissioner of Patents and Trademarks